United States Patent
Nagasaka et al.

(10) Patent No.: US 7,342,751 B2
(45) Date of Patent: Mar. 11, 2008

(54) MAGNETORESISTIVE EFFECT HAVING MULTIPLE BASE LAYERS BETWEEN AN ELECTRODE AND AN ANTIFERROMAGNETIC LAYER, MAGNETIC HEAD, AND MAGNETIC RECORDING DEVICE

(75) Inventors: Keiichi Nagasaka, Kawasaki (JP); Yutaka Shimizu, Kawasaki (JP); Atsushi Tanaka, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 387 days.

(21) Appl. No.: 11/072,164

(22) Filed: Mar. 3, 2005

(65) Prior Publication Data
US 2006/0092577 A1 May 4, 2006

(30) Foreign Application Priority Data
Oct. 28, 2004 (JP) .............................. 2004-314147

(51) Int. Cl.
*G11B 5/39* (2006.01)
(52) U.S. Cl. ................................. 360/324.1; 360/324.2
(58) Field of Classification Search ................ 360/322, 360/324.1–324.2
See application file for complete search history.

(56) References Cited

U.S. PATENT DOCUMENTS 6,317,299 B1 11/2001 Pinarbasi 6,735,058 B2 * 5/2004 Lin et al. .................... 360/319
2005/0073778 A1 * 4/2005 Hasegawa et al. ........ 360/324.1

FOREIGN PATENT DOCUMENTS

| JP | 7-287819 | 10/1995 |
| JP | 2000-216020 | 8/2000 |
| JP | 2001-325704 | 11/2001 |
| JP | 2003-317213 | 11/2003 |

OTHER PUBLICATIONS

Tanaka et al.; "Spin-Valve Heads in the current-Perpendicular-to-Plane Mode for Ultrahigh-Density Recording"; IEEE Trans. on Mag. Vo. 38, No. 1; pp. 84-88; Jan. 2002.

* cited by examiner

*Primary Examiner*—A. J. Heinz
(74) *Attorney, Agent, or Firm*—Greer, Burns & Crain, Ltd.

(57) ABSTRACT

The magnetoresistive effect element comprises an electrode layer 12 of a crystalline material; a base layer 14 of a conductive amorphous material formed over the electrode layer 12, an antiferromagnetic layer 18 of a crystalline material formed over the base layer 14, a ferromagnetic layer 20 formed over the antiferromagnetic layer 18 and having the magnetization direction defined by the antiferromagnetic layer 18, a nonmagnetic intermediate layer 22 formed over the ferromagnetic layer 20, a ferromagnetic layer 24 formed over the nonmagnetic intermediate layer 22 and having the magnetization direction changed by an external magnetic field, and an electrode layer 28 formed over the ferromagnetic layer 24.

20 Claims, 2 Drawing Sheets

MAGNETORESISTIVE EFFECT HAVING MULTIPLE BASE LAYERS BETWEEN AN ELECTRODE AND AN ANTIFERROMAGNETIC LAYER, MAGNETIC HEAD, AND MAGNETIC RECORDING DEVICE

CROSS-REFERENCE TO RELATED APPLICATIONS

This application is based upon and claims the benefit of priority from the prior Japanese Patent Application No. 2004-314147, filed on Oct. 28, 2004, the entire contents of which are incorporated herein by reference.

BACKGROUND OF THE INVENTION

The present invention relates to a magnetoresistive effect element, magnetic head and a magnetic recording device, more specifically a magnetoresistive effect element having the CPP (Current Perpendicular to Plane) structure, in which the so-called spin valve film is used, and sensing current is flowed in the direction of the film thickness, and a magnetic head and a magnetic recording device using the magnetoresistive effect element.

A magnetoresistive effect element using a spin valve film includes 2 magnetic layers: one magnetic layer of which has the magnetization direction pinned by unidirectional anisotropic magnetic field with respect to the antiferromagnetic layer, etc., and the other magnetic layer of which has the magnetization direction easily changed by an external magnetic field. The property that the element resistance is changed by a relative angle of magnetization directions of these magnetic layers is utilized to detect a direction of the external magnetic field, based on the change of the element resistance.

As the conventional magnetoresistive effect element using the spin valve film is known a magnetoresistive effect element of the CIP (Current In-Plane) structure, in which sensing current is flowed in the direction of the plane of the spin valve film to detect the resistance change in the direction of the in-plane of the film.

On the other hand, as the magnetoresistive effect element of higher density and higher sensitivity is noted a magnetoresistive effect element of the CPP (Current Perpendicular to Plane) structure, in which sensing current is flowed in the direction of the film thickness of the spin valve film to detect the film thickness-wise resistance changes. The magnetoresistive effect element of the CPP structure has a characteristic that as the size is smaller, the element output increases and is prospective as a readout head of high sensitivity for used in high density magnetic recording device.

The Related arts are disclosed in, e.g., Reference 1 (Japanese published unexamined patent application No. 2001-325704), Reference 2 (Japanese published unexamined patent application No. Hei 07-287819), Reference 3 (Japanese published unexamined patent application No. 2000-216020), Reference 4 (Japanese published unexamined patent application No. 2003-317213), Reference 5 (Atsushi Tanaka et al., "Spin-Valve Heads in the Current-Perpendicular-to-Plane Mode for Ultrahigh-Density Recording", IEEE Trans. Magn., Vol. 38, pp. 84-88, January 2002

SUMMARY OF THE INVENTION

To stably operate the magnetoresistive effect element as a magnetic head, it is necessary to sufficiently pin the magnetization direction of the pinned magnetic layer. As means for enhancing the magnetization pinning force (unidirectional anisotropic magnetic field), are the structure of a magnetization pinning layer divided in 2 layers which are antiferromagnetically coupled with each other with a nonmagnetic layer as of ruthenium (Ru) or others disposed therebetween, the so-called stacked-ferri structure, and the use of a material of the regular system (PtMn or others) as the antiferromagnetic layer for the magnetization pinning. In the latter, a base layer for the antiferromagnetic layer is formed of a suitable material to thereby increase the unidirectional anisotropic magnetic field. The typical material of the base layer is NiCr. Generally, NiCr has large grain sizes, which allows the grain size of an antiferromagnetic material formed thereon to be increased. This grain size increase can stabilize the magnetization in the antiferromagnetic layer and increase the unidirectional anisotropic magnetic field.

In the magnetoresistive effect element of the CIP structure, in which sensing current is flowed in the direction of the in-plane of the spin valve film, the lower shield and the spin valve film must be insulated from each other, and an insulating film of an amorphous insulating material, as of $Al_2O_3$ film or others, is formed between the lower shield and the spin valve film. In this case, the base layer of an antiferromagnetic material, such as NiCr or others, formed on the amorphous insulating film can have the grains grown to a grain diameter as large as about 1 µm.

In the magnetoresistive effect element of the CPP structure, however, in which sensing current must be flowed in the direction of the film thickness of the spin valve film, an insulating film cannot be provided between the base shield and the spin valve film, and the spin valve film must be formed on the base shield layer. However, NiFe which is the general material of the shield layer is crystalline material and, in addition, has so small a grain diameter as about 10's nm. Accordingly, the grain diameter of the base layer for the antiferromagnetic material epitaxially grown on the lower shield layer reflects the crystal grain size of the lower shield layer and becomes small. Resultantly, the grain diameter of the antiferromagnetic layer cannot become large, which lowers the exchange coupling force of the ferromagnetic layer formed on the antiferromagnetic layer, with a result that the output and the output stability of the head device are lowered.

An object of the present invention is to provide a magnetoresistive effect element of the CPP structure which increases the magnetization pinning force of the pinned magnetization layer to thereby improve the output and output stability of the element, and a magnetic head and a magnetic recording device using the magnetoresistive effect element.

According to one aspect of the present invention, there is provided a magnetoresistive effect element comprising: a first electrode layer of a crystalline material; a first base layer of a conductive amorphous material formed over the first electrode layer; an antiferromagnetic layer of a crystalline material formed over the first base layer; a first ferromagnetic layer formed over the antiferromagnetic layer and having a magnetization direction defined by the antiferromagnetic layer; a nonmagnetic intermediate layer formed over the first ferromagnetic layer; a second ferromagnetic layer formed over the nonmagnetic intermediate layer having a magnetization direction changed by an external magnetic field; and a second electrode layer formed over the second ferromagnetic layer with or without some conductive layers in therebetween.

According to another aspect of the present invention, there is provided a magnetic head comprising: a magnetoresistive effect element including: a first electrode layer of a crystalline material; a first base layer of a conductive amorphous material formed over the first electrode layer; an antiferromagnetic layer of a crystalline material formed over the first base layer; a first ferromagnetic layer formed over the antiferromagnetic layer and having a magnetization direction defined by the antiferromagnetic layer; a nonmagnetic intermediate layer formed over the first ferromagnetic layer; a second ferromagnetic layer formed over the nonmagnetic intermediate layer having a magnetization direction changed by an external magnetic field; and a second electrode layer formed over the second ferromagnetic layer, detecting a direction of the external magnetic field based on a resistance value change related to the relative angle between the first electrode layer and the second electrode layer by an external magnetic field.

According to further another aspect of the present invention, there is provided a magnetic recording device comprising: a magnetic recording medium; a writing element for applying a recording magnetic field to the magnetic recording medium to record magnetic information; and a magnetoresistive effect element for detecting the magnetic information recorded in the magnetic recording medium, based on a resistance value change, the magnetoresistive effect element including: a first electrode layer of a crystalline material; a first base layer of a conductive amorphous material formed over the first electrode layer; an antiferromagnetic layer of a crystalline material formed over the first base layer; a first ferromagnetic layer formed over the antiferromagnetic layer and having a magnetization direction defined by the antiferromagnetic layer; a nonmagnetic intermediate layer formed over the first ferromagnetic layer; a second ferromagnetic layer formed over the nonmagnetic intermediate layer having a magnetization direction changed by an external magnetic field; and a second electrode layer formed over the second ferromagnetic layer.

According to the present invention, in the magnetoresistive effect element of the CPP structure, the base layer of a conductive amorphous material is formed between the antiferromagnetic layer and the lower shield layer, whereby the crystal grain growth of the antiferromagnetic layer can be enhanced without being influenced by the crystal structure of the lower shield layer. This can increase the magnetization pinning force of the pinned magnetization layer formed on the antiferromagnetic layer, and the output and output stability of the magnetoresistive effect element can be improved. The magnetic head and the magnetic recording device using such magnetoresistive effect element can improve the recording density and the yield of these devices.

DETAILED DESCRIPTION OF THE INVENTION

Figure 1:
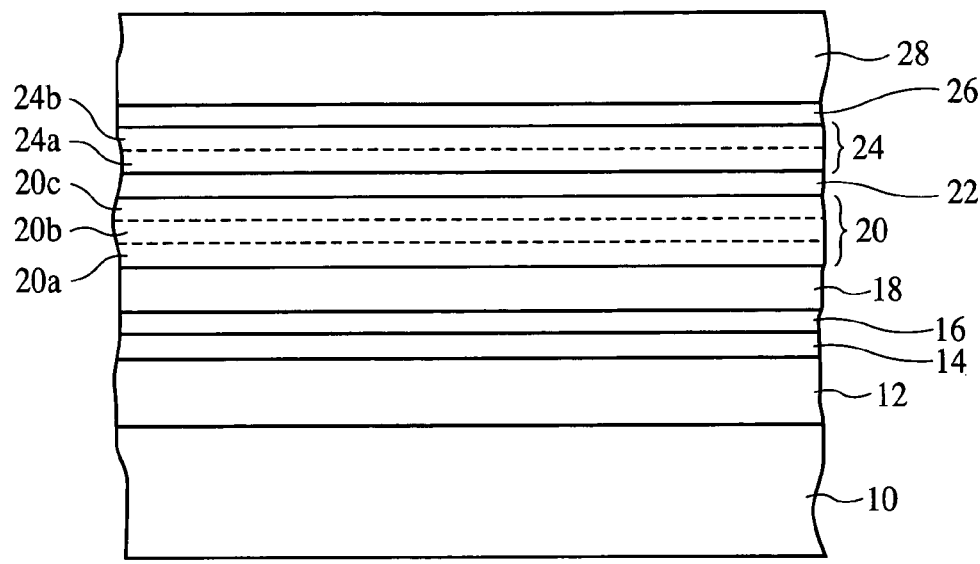
FIG. 1 is a diagrammatic sectional view of the magnetoresistive effect element according to a first embodiment of the present invention, which shows a structure thereof.

The magnetoresistive effect element and the method for fabricating the same according to a first embodiment of the present invention will be explained with reference to FIG. 1. FIG. 1 is a diagrammatic sectional view of the magnetoresistive effect element according to the present embodiment, which shows a structure thereof.

First, the structure of the magnetoresistive effect element according to the present embodiment will be explained with reference to FIG. 1.

A lower shield layer 12 of a soft magnetic material, such as NiFe or others, is formed on a ceramic substrate 10. The lower shield layer 12 acts also as a lower electrode. On the lower shield layer 12, a first base layer 14 of a conductive amorphous material, such as CoFeB, TiSi, CoZrNb or others, is formed. On the first base layer 14, a second base layer 16 of NiCr or others for the base layer of an antiferromagnetic layer is formed. On the second base layer 16, an antiferromagnetic layer 18 of an antiferromagnetic material, such as PtMn or others, is formed. On the antiferromagnetic layer 18, a pinned magnetization layer 20 of an ferromagnetic material is formed. As exemplified in FIG. 1, a pinned magnetization layer 20 has the stacked ferri structure of a ferromagnetic layer 20a of a ferromagnetic material, such as CoFe or others, a nonmagnetic layer 20b of a nonmagnetic material, such as Ru or others, and a ferromagnetic layer 20c of a ferromagnetic material, such as CoFe or others. On the pinned magnetization layer 20, a nonmagnetic intermediate layer 22 of a nonmagnetic material, such as Cu or others, is formed. On the nonmagnetic intermediate layer 22 a free magnetization layer 24 of a layer film of, e.g., a CoFe film 24a and an NiFe film 24b is formed. On the free magnetization layer 24, a cap layer 26 of a nonmagnetic material, such as Ta or others, is formed. On the cap layer 26 an upper shield layer 28 of a soft magnetic material, such as NiFe or others, is formed. The upper shield layer 28 acts also as an upper electrode.

As described above, in the magnetoresistive effect element according to the present embodiment, between the lower shield layer 12 and the antiferromagnetic layer 18, the first base layer 14 of a conductive amorphous material, such as CoFeB, TiSi, CoZrNb or others, and the second base layer 16 of NiCr or others for the base layer of an antiferromagnetic layer is formed.

The first base layer 14 is for enhancing the crystal grain growth of the second base layer 16 without being influenced by a crystal structure of the lower shield layer 12. To this end, the first base layer is formed of an amorphous material. In the magnetoresistive effect element of the CPP structure, in which sensing current must be flowed in the direction of the film thickness of the spin valve film, so that the base layer 14 is formed of a conductive material.

The material of the first base layer 14 is preferably less resistive from the viewpoint of suppressing the element resistance increase. CoFeB, TiSi and CoZrNb described above respectively have an about 40-60 $\mu\Omega$-cm, an about 100 $\mu\Omega$-cm and an about 150 $\mu\Omega$-cm. Their specific resistance is smaller than the specific resistance of PtMn, about 200 $\mu\Omega$-cm, and the use of these materials can sufficiently suppress the element resistance increase.

To lower the element resistance, it is preferable to thin the first base layer 14. Thinning the first base layer 14 leads to decreasing the distance between the upper and the lower shield layers. The distance between the upper and the lower shield layers influences the resolution of the magnetic head, and as the distance is smaller, the recording density of the magnetic recording device can be improved.

From this viewpoint, the film thickness of the first base layer 14 will be suitably not more than 10 nm, preferably not more than 5 nm. The lower limit of the film thickness is defined to be a minimum film thickness which can attain the purpose of enhancing the crystal grain growth of the second base layer 16 without being influenced by the crystal structure of the lower shield layer 12 and is not less than 1 nm.

When the first base layer 14 is formed of a soft magnetic material, such as CoFeB, CoZrNb or others, the first base layer 14 can be a part of the lower shield layer 12. In this case, the distance between the upper and the lower shield layers (inter-shield gap) can be accordingly decreased, which can further improve the recording density of the magnetic disc device.

The second base layer 16 is formed of, e.g., Ni(Fe)Cr or others. The second base layer 16 is for enhancing the crystal growth and easily regular alloying the antiferromagnetic layer 18 to be formed on the surface of the second base layer 16.

The first base layer 14 is formed below the second base layer 16, whereby the crystal grain growth of the second base layer 16 can be enhanced without being influenced by the crystal structure of the lower shield layer 10, and the second base layer 16 can be grown to so large a grain diameter as, e.g., about 1 µm.

The growth of the crystal grain of the antiferromagnetic layer 18 epitaxially grown on the second base layer 16 is accordingly enhanced. Thus, the exchange bonding force of the pinned magnetization layer 20 formed on the antiferromagnetic layer 18 is increased, whereby the output and output stability as the head element can be increased.

As in the magnetoresistive effect element according to the present embodiment, the pinned magnetization layer 20 has the stacked ferri structure, whereby the exchange coupling force between the antiferromagnetic layer 18 and the pinned magnetization layer 20 can be further enhanced, and the output and output stability as the head element can be further increased.

Next, the method for fabricating the magnetoresistive effect element according to the present embodiment will be explained with reference to FIG. 1.

First, on the ceramic substrate 10, a NiFe of, e.g., some µm-thick is formed by, e.g., electroplating to thereby form the lower shield layer 12 of the NiFe. The lower shield layer 12 is patterned into a prescribed pattern by a patterning process.

Then, on the lower shield layer 12, CoFeB, TiSi or CoZrNb of a film thickness of, e.g., not more than 10 nm is formed by, e.g., sputtering to thereby form the first base layer 14 of such conductive amorphous material.

Then, on the first base layer 14, the second base layer 16 of NiCr of, e.g., a 5 nm-thick is formed by, e.g., sputtering. At this time, because the first base layer 14 of an amorphous material is formed below the second base layer 16, the second base layer 16 having a large grain diameter can be grown without reflecting the crystal structure of the lower shield layer 12.

Then, on the second base layer 16, the antiferromagnetic layer 18 of, e.g., a 10 nm-thick PtMn, a ferromagnetic layer 20a of, e.g., a 3 nm-thick CoFe, a nonmagnetic intermediate layer 22, e.g., a 3 nm-thick Cu, the free magnetization layer 24 including, e.g., 1 nm-thick CoFe film 24a and, e.g., 3 nm-thick NiFe film 24b, and a cap layer 26 of, e.g., a 3 nm-thick Ta are sequentially formed. Then, these films are configured, and insulating films and a magnetic domain control film are formed.

Then, on the cap layer 26, NiFe of, e.g., some µm-thick is formed by, e.g., electroplating, and the upper shield layer 28 of NiFe is formed.

The magnetoresistive effect element according to the present embodiment shown in FIG. 1 is thus fabricated.

As described above, according to the present embodiment, in the magnetoresistive effect element of the CPP structure, the base layer of a conductive amorphous material is formed between the lower shield layer and the base layer for enhancing the crystal growth of the antiferromagnetic layer for regular alloying, whereby the crystal grain growth of the base layer for the antiferromagnetic layer is enhanced without being influenced by the crystal structure of the lower shield layer. This increases the crystal grain diameter of the antiferromagnetic layer to be formed on the base layer for the antiferromagnetic layer, whereby the magnetization pinning force of the pinned magnetization layer can be increased, and the output and output stability of the magnetoresistive effect element can be improved.

A Second Embodiment

The magnetic recording device according to a second embodiment of the present invention will be explained with reference to FIGS. 2 and 3. The same members of the present embodiment as those of the magnetoresistive effect element according to the first embodiment shown in FIG. 1 are represented by the same reference numbers not to repeat or to simplify their explanation.

Figure 2:
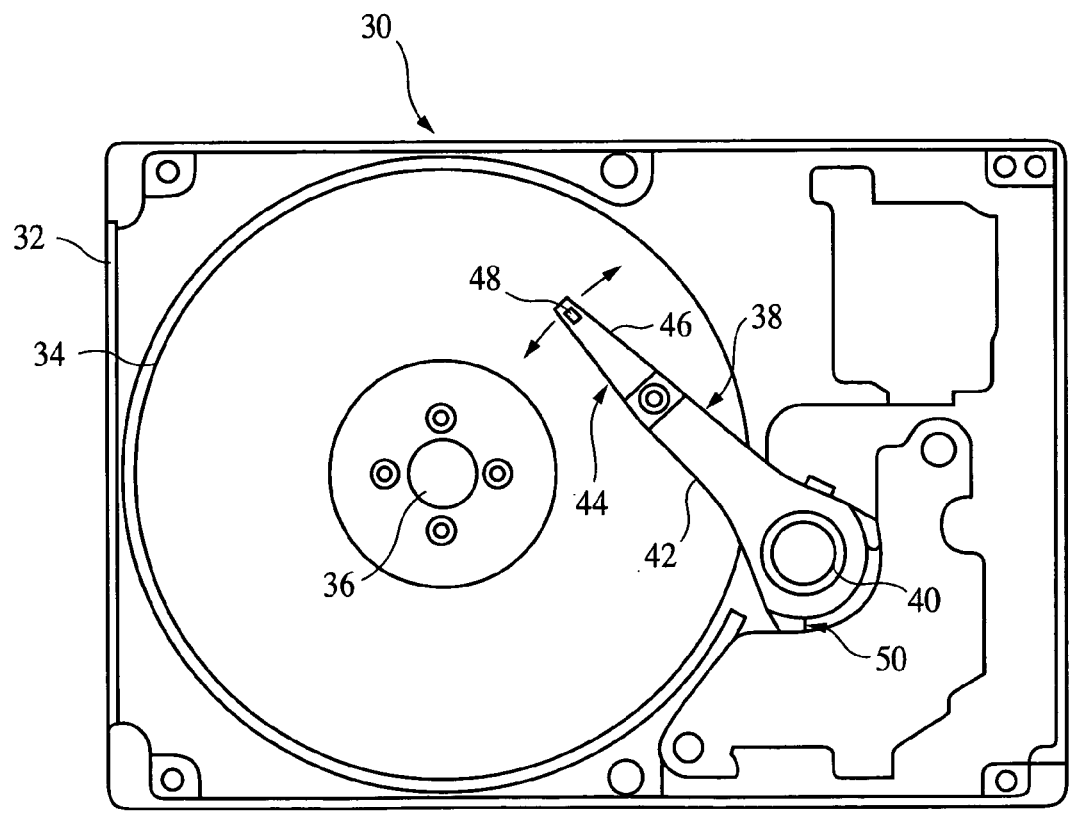
FIG. 2 is a diagrammatic plan view of the magnetic recording device according to a second embodiment of the present invention, which shows a structure thereof.

FIG. 2 is a diagrammatic plan view of the magnetic recording device according to the present embodiment, which shows a structure thereof. FIG. 3 is a front view of the magnetic head of the magnetic recording device according to the present embodiment, which shows a structure thereof.

First, the structure of the magnetic recording device according to the present embodiment will be explained with reference to FIG. 2.

The magnetic recording device 30 according to the present embodiment includes a box-shaped hollow body 32 defining an interior space of, e.g., a laterally extended cuboid. The housing space accommodates one or more magnetic discs 34 as recording media. The magnetic disc 34 is mounted on the spindle of a spindle motor 36. The spindle motor 36 can rotate the magnetic disc 34 at a high speed of, e.g., 7200 rpm and 10000 rpm. A cover (not shown), i.e., a lid for tightly closing the housing space in cooperation with the hollow body 32 is connected to the hollow body 32.

The housing space further accommodates a head actuator 38. The head actuator 38 is disposed rotatably on a support rod 40 vertically extended. The head actuator 38 includes a plurality of actuator arms 42 extended horizontally from the support rod 40, and head suspension assemblies 44 extended forward from the actuator arms 42 disposed on the forward ends of the respective actuator arms 42. The actuator arms 42 are disposed respectively on the front side and the backside of the magnetic discs 34.

The head suspension assembly 44 includes a load beam 46. The load beam 46 is the so-called elastic flexure area and is connected to the forward end of the actuator arm 42. The elastic flexure area acts to exert a prescribed urging force to the surface of the magnetic disc 34. A magnetic head 48 is mounted on the forward end of the load beam 46. The magnetic head 48 is received, capably of freely changing the posture, by gimbals (not shown) secured to the load beam 46.

When an air flow is produced on the surface of the magnetic disc 34 by the rotation of the magnetic disc 34, the air flow exerts positive pressure, i.e., buoyant force, and negative pressure to the magnetic head 48. The buoyant force, the negative pressure and the urging force are balanced to thereby permit the magnetic head 48 to keep floating with relatively high rigidity during the rotation of the magnetic disc 34.

A power source 50, e.g., a voice coil motor (VCM) is connected to the actuator arm 42. The power source 50 rotates the actuator arm 42 on the support rod 40. The rotated actuator arm 42 can move the head suspension assembly 44. When the actuator arm 42 is swung during the magnetic head 48 is floating, the magnetic head 48 can radially cross the surface of the magnetic disc 34. This movement can position the magnetic head 48 at a required recording track on the magnetic disc 34.

Next, the magnetic head 48 of the magnetic recording device according to the present embodiment will be detailed with reference to FIG. 3.

Figure 3:
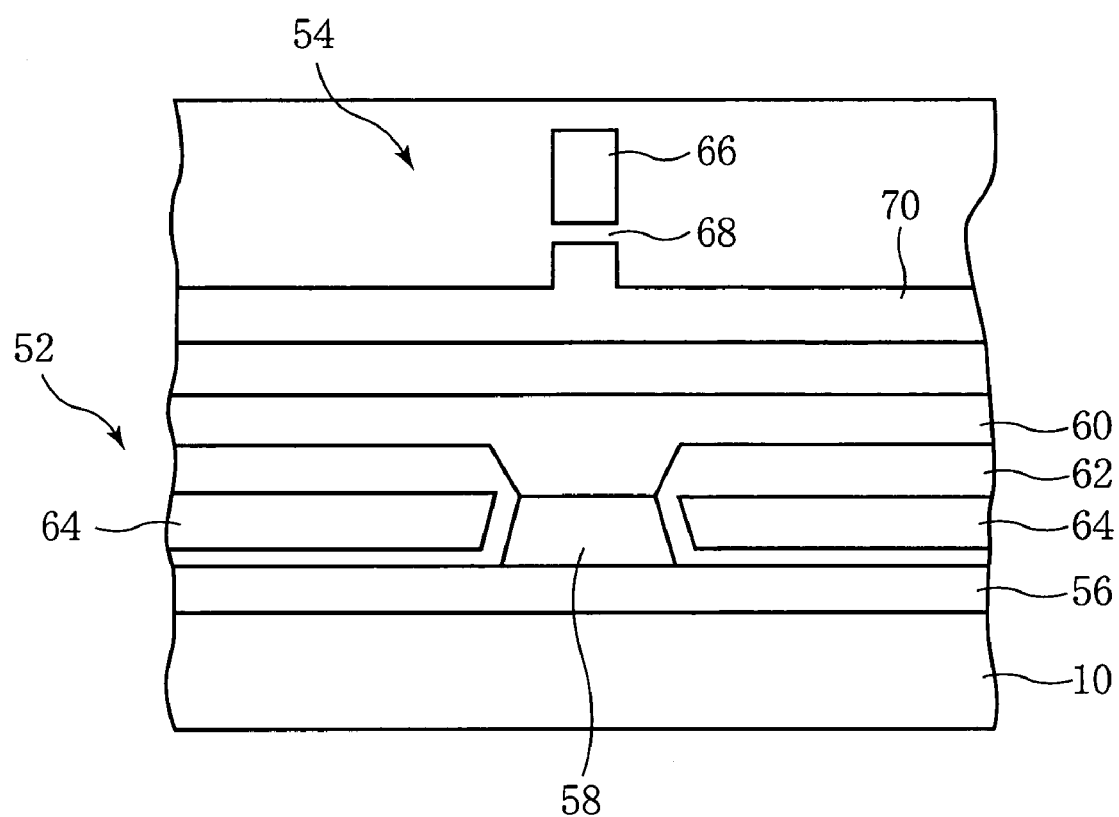
FIG. 3 is a front view of the magnetic head of the magnetic recording device according to the second embodiment of the present invention, which shows a structure thereof.

As shown in FIG. 3, a magnetic head 48 including an induction-type writing element 54 and a magnetoresistive effect element 52 generally comprises a magnetoresistive effect element 52 and the induction-type writing element 54 formed sequentially the latter on the former on a flat ceramic substrate 10 of $Al_2O_3$—TiC (AlTiC) as the base of the head slider, which are covered by an insulator of, e.g., alumina or others.

The magnetoresistive effect element 52 is the magnetoresistive effect element according to, e.g., the first embodiment of the present invention, and comprises on the ceramic substrate 10 a lower electrode 56, a spin valve film 58 formed on the lower electrode 56, an upper electrode 60 formed on the spin valve film 58 and a magnetic domain control layer 64 disposed on both sides of the spin valve film 58 with an insulating film 62 formed therebetween.

The lower electrode 56 and the upper electrode 60 function as the path of the sensing current and also as the magnetic shield and correspond respectively to the lower shield layer 12 and the upper shield layer 28 of the magnetoresistive effect element according to the first embodiment. The spin valve film 58 corresponds to the layer film from the first base layer 14 to the cap layer 26 of the magnetoresistive effect element according to the first embodiment shown in FIG. 1. The first base layer 14 may be formed as the uppermost film of the lower electrode 56 or as the lowermost film of the spin valve film 58. The magnetic domain control layer 64 defines the free magnetization layer 24 in a single magnetization domain and is for preventing the generation of Barkhausen noises.

The induction-type writing element 54 comprises an upper magnetic pole 66 having a width corresponding to a track width in the surface opposed to the magnetic disc 34, a lower magnetic pole 70 opposed to the upper magnetic pole 66 with a nonmagnetic gap layer 68 formed therebetween, a yoke (not shown) connecting the upper magnetic pole 66 and the lower magnetic pole 70 with each other, a coil (not shown) wound around the yoke, etc. The upper magnetic pole 66, the lower magnetic pole and the yoke are formed of a soft magnetic material and suitably of a material of high saturation flux density, e.g., FeCo alloy or others.

The writing in the magnetic disc 34 with the magnetic head 48 is made by the induction-type writing element 54. That is, magnetic field leaking between the upper magnetic pole 66 and the lower magnetic pole 70 records information in the magnetic disc 34 opposed to the induction-type writing element 54.

The readout of the information written in the magnetic disc 34 is made by the magnetoresistive effect element 52. That is, magnetic field leaking based on the information recorded in the magnetic disc 34 is detected as resistance changes of the spin valve film 58 to thereby read the information recorded in the magnetic disc 34.

As described above, according to the present embodiment, the magnetoresistive effect element according to the first embodiment is applied to the magnetic head of the magnetic recording device, whereby the output and output stability of the magnetic head can be improved. The recording density and the yield of the magnetic recording device can be accordingly improved.

Modified Embodiments

The present invention is not limited to the above-described embodiments and can cover other various modifications.

For example, in the first embodiment described above, the pinned magnetization layer 20 is formed of the layer structure of the ferromagnetic layer 20a, nonmagnetic layer 20b, and the ferromagnetic layer 20a, but may be formed of one ferromagnetic layer.

In the first embodiment described above, the first base layer 14 is formed directly on the lower shield layer 12, but is not essentially formed directly on the lower shield layer 12. One layer, or 2 or more layers may be formed between the lower shield layer 12 and the first base layer 14.

In the first embodiment described above, the second base layer 16 is formed directly on the first base layer 14 but may not be formed essentially directly on the first base layer 14. One layer, or 2 or more layers may be further formed between the first base layer 14 and the second base layer 16 unless the layer hinders the crystal grain growth of the second base layer 16.

In the first embodiment described above, the second base layer 16 is formed between the first base layer 14 and the antiferromagnetic layer 18 but may not be essentially formed. The first base layer 14 is formed of an amorphous material, whereby the crystal structure of the lower shield layer 12 is never reflected by the upper layer. Accordingly, the second base layer 16 may not be formed in a case that an antiferromagnetic layer of a required grain size can be formed directly on the first base layer 14.

The materials of the respective layers of the magnetoresistive effect element according to the first embodiment described above are not limited to those described in the above-described embodiments and can be suitably changed.

In the embodiments described above, the magnetoresistive effect element according to the present invention is applied to the magnetic head of the magnetic recording device but can be applied to other devices. For example, an MRAM (Magnetoresistive Random Access Memory) including the magnetoresistive effect element as a memory cell, the same base layer as the first base layer 14 of the first embodiment is formed below the spin valve film, whereby the magnetization pinning force of the pinned magnetization layer can be increased irrespective of the crystal structure of the base material, whereby the output and output stability of the memory cells can be improved.

What is claimed is:

1. A magnetoresistive effect element comprising:
a first electrode layer of a crystalline material;
a first base layer of a conductive amorphous material formed over the first electrode layer;
a second base layer of a crystalline material formed over the first base layer and having a larger crystal grain diameter than a crystal grain diameter of the crystalline material forming the first electrode layer;

an antiferromagnetic layer of a crystalline material formed over the second base layer, the antiferromagnetic layer having a crystal structure reflecting a crystal structure of the second base layer;

a first ferromagnetic layer formed over the antiferromagnetic layer and having a magnetization direction defined by the antiferromagnetic layer;

a nonmagnetic intermediate layer formed over the first ferromagnetic layer;

a second ferromagnetic layer formed over the nonmagnetic intermediate layer having a magnetization direction changed by an external magnetic field; and a second electrode layer formed over the second ferromagnetic layer.

2. A magnetoresistive effect element according to claim 1, wherein
a specific resistance of the amorphous material forming the first base layer is not more than 200 µΩ-cm.

3. A magnetoresistive effect element according to claim 1, wherein
a film thickness of the first base layer is not more than 10 nm.

4. A magnetoresistive effect element according to claim 1, wherein
a film thickness of the first base layer is not more than 5 nm.

5. A magnetoresistive effect element according to claim 1, wherein
the amorphous material forming the first base layer is a soft magnetic material.

6. A magnetoresistive effect element according to claim 1, wherein
the amorphous material forming the first base layer is TiSi, CoFeB or CoZrNb.

7. A magnetoresistive effect element according to claim 1, wherein
the first electrode layer and the second electrode layer are formed of a soft magnetic material and function as magnetic shields.

8. A magnetoresistive effect element according to claim 1, wherein
the first ferromagnetic layer has a stacked ferri structure.

9. A magnetic head comprising:
a magnetoresistive effect element including:
a first electrode layer of a crystalline material;
a base layer of a conductive amorphous material formed over the first electrode layer;
an antiferromagnetic layer of a crystalline material formed directly on the base layer;
a first ferromagnetic layer formed over the antiferromagnetic layer and having a magnetization direction defined by the antiferromagnetic layer;
a nonmagnetic intermediate layer formed over the first ferromagnetic layer;
a second ferromagnetic layer formed over the nonmagnetic intermediate layer having a magnetization direction changed by an external magnetic field; and
a second electrode layer formed over the second ferromagnetic layer,
the magnetoresistive effect element detecting a direction of the external magnetic field based on a resistance value change between the first electrode layer and the second electrode layer by the external magnetic field.

10. A magnetic recording device comprising:
a magnetic recording medium;
a writing element for applying a recording magnetic field to the magnetic recording medium to record magnetic information; and
a magnetoresistive effect element for detecting the magnetic information recorded in the magnetic recording medium, based on a resistance value change, the magnetoresistive effect element including:
a first electrode layer of a crystalline material;
a base layer of a conductive amorphous material formed over the first electrode layer;
an antiferromagnetic layer of a crystalline material formed directly on the base layer;
a first ferromagnetic layer formed over the antiferromagnetic layer and having a magnetization direction defined by the antiferromagnetic layer;
a nonmagnetic intermediate layer formed over the first ferromagnetic layer;
a second ferromagnetic layer formed over the nonmagnetic intermediate layer having a magnetization direction changed by an external magnetic field; and
a second electrode layer formed over the second ferromagnetic layer.

11. A magnetic head comprising:
a magnetoresistive effect element including:
a first electrode layer of a crystalline material;
a first base layer of a conductive amorphous material formed over the first electrode layer;
a second base layer of a crystalline material formed over the first base layer and having a larger crystal grain diameter than a crystal grain diameter of the crystalline material forming the first electrode layer;
an antiferromagnetic layer of a crystalline material formed over the second base layer, the antiferromagnetic layer having a crystal structure reflecting a crystal structure of the second base layer;
a first ferromagnetic layer formed over the antiferromagnetic layer and having a magnetization direction defined by the antiferromagnetic layer;
a nonmagnetic intermediate layer formed over the first ferromagnetic layer;
a second ferromagnetic layer formed over the nonmagnetic intermediate layer having a magnetization direction changed by an external magnetic field; and
a second electrode layer formed over the second ferromagnetic layer,
the magnetoresistive effect element detecting a direction of the external magnetic field based on a resistance value change between the first electrode layer and the second electrode layer by the external magnetic field.

12. A magnetic recording device comprising:
a magnetic recording medium;
a writing element for applying a recording magnetic field to the magnetic recording medium to record magnetic information; and
a magnetoresistive effect element for detecting the magnetic information recorded in the magnetic recording medium, based on a resistance value change, the magnetoresistive effect element including:
a first electrode layer of a crystalline material;
a first base layer of a conductive amorphous material formed over the first electrode layer;
a second base layer of a crystalline material formed over the first base layer and having a larger crystal grain diameter than a crystal grain diameter of the crystalline material forming the first electrode layer;

an antiferromagnetic layer of a crystalline material formed over the second base layer, the antiferromagnetic layer having a crystal structure reflecting a crystal structure of the second base layer;

a first ferromagnetic layer formed over the antiferromagnetic layer and having a magnetization direction defined by the antiferromagnetic layer;

a nonmagnetic intermediate layer formed over the first ferromagnetic layer;

a second ferromagnetic layer formed over the nonmagnetic intermediate layer having a magnetization direction changed by an external magnetic field; and a second electrode layer formed over the second ferromagnetic layer.

13. A magnetoresistive effect element comprising:

a first electrode layer of a crystalline material;

a base layer of a conductive amorphous material formed over the first electrode layer;

an antiferromagnetic layer of a crystalline material formed directly on the base layer;

a first ferromagnetic layer formed over the antiferromagnetic layer and having a magnetization direction defined by the antiferromagnetic layer;

a nonmagnetic intermediate layer formed over the first ferromagnetic layer;

a second ferromagnetic layer formed over the nonmagnetic intermediate layer having a magnetization direction changed by an external magnetic field; and a second electrode layer formed over the second ferromagnetic layer.

14. A magnetoresistive effect element according to claim 13, wherein a specific resistance of the amorphous material forming the base layer is not more than 200 $\mu\Omega$-cm.

15. A magnetoresistive effect element according to claim 13, wherein a film thickness of the base layer is not more than 10 nm.

16. A magnetoresistive effect element according to claim 13, wherein a film thickness of the base layer is not more than 5 nm.

17. A magnetoresistive effect element according to claim 13, wherein the amorphous material forming the base layer is a soft magnetic material.

18. A magnetoresistive effect element according to claim 13, wherein the amorphous material forming the base layer is TiSi, CoFeB or CoZrNb.

19. A magnetoresistive effect element according to claim 13, wherein the first ferromagnetic layer has a stacked ferri structure.

20. A magnetoresistive effect element according to claim 13, wherein the first electrode layer and the second electrode layer are formed of a soft magnetic material and function as magnetic shields.

* * * * *